(12) United States Patent
Zhitomirsky (10) Patent No.: US 11,927,740 B2
(45) Date of Patent: Mar. 12, 2024

(54) SPATIALLY VARIABLE HYDROPHOBIC LAYERS FOR DIGITAL MICROFLUIDICS

(71) Applicant: Nuclera Ltd, Cambridge (GB)

(72) Inventor: David Zhitomirsky, Woburn, MA (US)

(73) Assignee: Nuclera LTD, Cambridge (GB)

( * ) Notice: Subject to any disclaimer, the term of this patent is extended or adjusted under 35 U.S.C. 154(b) by 355 days.

(21) Appl. No.: 16/952,642

(22) Filed: Nov. 19, 2020

(65) Prior Publication Data

US 2021/0149184 A1 May 20, 2021

Related U.S. Application Data

(60) Provisional application No. 62/937,897, filed on Nov. 20, 2019.

(51) Int. Cl.
*G02B 26/00* (2006.01)
*H01L 27/12* (2006.01)

(52) U.S. Cl.
CPC ........ *G02B 26/005* (2013.01); *H01L 27/1214* (2013.01)

(58) Field of Classification Search
CPC ....... B01L 3/502792; B01L 2400/0427; B01L 2300/161; B01L 2300/0645; B01L 2300/0887; B01L 3/50273; B01L 3/502707; B01L 3/502715; B01L 2300/0816; B01L 3/502784; B01L 2200/0673; B01L 2300/12; B01L 2300/165; B01L 2300/1827; B01L 2400/0415; B01L 2200/12; B01L 3/5027; B01L 2300/089; B01L 2200/10; B01L 2300/0819; B01L 7/52; B01L 3/502761; B01L 2200/147; B01L 2300/0663; B01L 2400/02; B01L 3/5085; B01L 2400/0424; B01L 2300/024; B01L 2300/0809; B01L 2300/0864; B01L 2300/16; B01L 2300/0636; B01L 3/0241; B01L 2200/023; B01L 2200/027; B01L 2200/0642; B01L 2200/143; B01L 2300/0654;
(Continued)

(56) References Cited

U.S. PATENT DOCUMENTS 3,813,519 A   5/1974   Jochin et al.
5,311,337 A   5/1994   McCartney, Jr.
(Continued)

FOREIGN PATENT DOCUMENTS

CN   102389840 A   3/2012
CN   108393101 A   8/2018
(Continued)

OTHER PUBLICATIONS

Taiwan Search Report for Application No. 109140736, dated Feb. 2, 2022, 1 page.
(Continued)

*Primary Examiner* — Brandi N Thomas
(74) *Attorney, Agent, or Firm* — McCarter & English, LLP (57) ABSTRACT

An active matrix electrowetting on dielectric (AM-EWoD) device including a substrate with thin-film transistors (TFT), a dielectric layer, and a spatially variable wettability layer covering the dielectric layer. As depicted herein, the spatially variable wettability layer may include a plurality of portions having different contact angles, one or more contact angle gradients, or both.

19 Claims, 5 Drawing Sheets

(58) Field of Classification Search
CPC ..... B01L 2300/0861; B01L 2300/0867; B01L 2300/1805; B01L 2400/0421; B01L 2400/0439; B01L 7/525; B01L 2200/022; B01L 2200/0605; B01L 2200/0647; B01L 2200/0668; B01L 2200/0678; B01L 2200/0684; B01L 2300/0845; B01L 2300/0883; B01L 2300/18; B01L 2300/1822; B01L 2400/0406; B01L 2400/043; B01L 2400/0442; B01L 3/502738; B01L 2200/06; B01L 2200/0652; B01L 2200/0694; B01L 2200/14; B01L 2200/16; B01L 2300/06; B01L 2300/0874; B01L 2300/163; B01L 2400/027; B01L 2400/0418; B01L 2400/0448; B01L 2400/0677; B01L 2400/0688; B01L 2400/086; B01L 3/0268; B01L 7/00; B01L 7/54; H01L 51/0545; H01L 51/052; H01L 27/283; H01L 51/0012; H01L 51/0541; H01L 51/0004; H01L 51/002; H01L 51/0021; H01L 27/32; H01L 21/31133; H01L 51/52; H01L 21/76838; H01L 51/0036; H01L 51/0018; H01L 51/0005; H01L 27/1248; H01L 2924/0002; H01L 51/0043; H01L 51/0037; H01L 27/1214; H01L 51/0039; H01L 27/1292; H01L 51/0019; H01L 51/0059; H01L 27/1251; H01L 27/1255; H01L 51/0023; H01L 27/3246; H01L 51/105; H01L 51/56; H01L 21/76807; H01L 21/76814; H01L 27/3244; H01L 51/0022; H01L 51/0052; H01L 51/0525; H01L 21/02126; H01L 21/6715; H01L 21/76801; H01L 21/76832; H01L 21/76834; H01L 23/53238; H01L 23/53295; H01L 27/12; H01L 29/4908; H01L 29/786; H01L 43/12; H01L 51/0045; H01L 51/0058; H01L 21/02203; H01L 21/02274; H01L 21/02337; H01L 21/288; H01L 21/76802; H01L 2251/5323; H01L 23/5329; H01L 27/1259; H01L 27/1446; H01L 28/40; H01L 28/55; H01L 29/66765; H01L 2924/12044; H01L 2924/19041; H01L 51/0076; H01L 51/0512; H01L 21/00; H01L 21/02178; H01L 21/02181; H01L 21/02183; H01L 21/022; H01L 21/02216; H01L 21/02258; H01L 21/0228; H01L 21/02282; H01L 21/02532; H01L 21/18; H01L 21/205; H01L 21/28194; H01L 21/31144; H01L 21/31965; H01L 21/32139; H01L 21/326; H01L 21/60; H01L 21/76811; H01L 21/76813; H01L 21/76822; H01L 21/76843; H01L 21/76846; H01L 21/76883; H01L 21/76888; H01L 2224/0231; H01L 2224/02311; H01L 2224/02375; H01L 2224/02377; H01L 2224/024; H01L 2224/0401; H01L 2224/05124; H01L 2224/05147; H01L 2224/05155; H01L 2224/05166; H01L 2224/05171; H01L 2224/05548; H01L 2224/05569; H01L 2224/05624; H01L 2224/05644; H01L 2224/05647; H01L 2224/05655; H01L 2224/05671; H01L 2224/13; H01L 2224/13024; H01L 2224/13099; H01L 2224/131; H01L 23/485; H01L 23/5223; H01L 23/5226; H01L 23/528; H01L 23/5286; H01L 23/53228; H01L 23/53233; H01L 24/02; H01L 24/05; H01L 24/11; H01L 24/13; H01L 27/0805; H01L 27/1225; H01L 27/1244; H01L 27/1277; H01L 27/28; H01L 29/513; H01L 29/518; H01L 29/78603; H01L 29/78669; H01L 2924/0001; H01L 2924/01005; H01L 2924/01006; H01L 2924/01013; H01L 2924/01015; H01L 2924/01022; H01L 2924/01024; H01L 2924/01029; H01L 2924/01033; H01L 2924/01074; H01L 2924/01076; H01L 2924/01078; H01L 2924/01079; H01L 2924/01082; H01L 2924/014; H01L 2924/12042; H01L 2924/13091; H01L 2924/14; H01L 2924/19043; H01L 2924/30105; H01L 2924/3011; H01L 2924/3025; H01L 35/32; H01L 51/00; H01L 51/0054; H01L 51/0055; H01L 51/0056; H01L 51/0068; H01L 51/0508; H01L 51/0516; H01L 51/0537; H01L 51/055; H01L 51/0595; H01L 51/50; H01L 51/5012; H01L 51/5203; H01L 21/02; H01L 21/02041; H01L 21/02043; H01L 21/02046; H01L 21/02054; H01L 21/0206; H01L 21/02148; H01L 21/02164; H01L 21/0217; H01L 21/02172; H01L 21/02175; H01L 21/02189; H01L 21/02192; H01L 21/02205; H01L 21/02247; H01L 21/02263; H01L 21/02288; H01L 21/02299; H01L 21/02307; H01L 21/0234; H01L 21/02348; H01L 21/02381; H01L 21/02395; H01L 21/02422; H01L 21/02538; H01L 21/02601; H01L 21/02628; H01L 21/02639; H01L 21/0274; H01L 21/0337; H01L 21/28008; H01L 21/28185; H01L 21/28202; H01L 21/28211; H01L 21/30; H01L 21/30655; H01L 21/3105; H01L 21/31111; H01L 21/3121; H01L 21/3122; H01L 21/316; H01L 21/31604; H01L 21/31662; H01L 21/31683; H01L 21/3185; H01L 21/3205; H01L 21/34; H01L 21/4867; H01L 21/67028; H01L 21/67069; H01L 21/6708; H01L 21/67115; H01L 21/67155; H01L 21/67173; H01L 21/67253; H01L 21/6831; H01L 21/6833; H01L 21/7682; H01L 21/76826; H01L 21/76835; H01L 21/76877; H01L 21/76885; H01L 21/823857; H01L 22/00; H01L 22/32; H01L 2221/1036; H01L 2221/1047; H01L 2224/02379; H01L 2224/0392; H01L 2224/16; H01L 2224/16225; H01L 2251/5315; H01L 23/345; H01L 23/473; H01L 23/48; H01L 23/5222; H01L 23/5384; H01L 27/016; H01L 27/04; H01L 27/0808; H01L 27/105; H01L 27/11502; H01L 27/11521; H01L 27/11526; H01L 27/1218; H01L 27/1222; H01L 27/124; H01L 27/1281; H01L 27/14601; H01L 27/14603; H01L
27/14621; H01L 27/14625; H01L
27/14645; H01L 27/14806; H01L
27/3232; H01L 27/3258; H01L 27/3262;
H01L 27/3265; H01L 28/60; H01L 29/04;
H01L 29/0665; H01L 29/0673; H01L
29/068; H01L 29/15; H01L 29/40114;
H01L 29/41733; H01L 29/45; H01L
29/458; H01L 29/517; H01L 29/66757;
H01L 29/7869; H01L 29/78696; H01L
2924/09701; H01L 31/075; H01L 33/08;
H01L 33/118; H01L 35/00; H01L 35/26;
H01L 35/28; H01L 41/082; H01L 41/18;
H01L 41/316; H01L 41/317; H01L
51/0003; H01L 51/0007; H01L 51/001;
H01L 51/0014; H01L 51/0015; H01L
51/0016; H01L 51/0024; H01L 51/0034;
H01L 51/0035; H01L 51/0038; H01L
51/0042; H01L 51/0048; H01L 51/005;
H01L 51/0064; H01L 51/0071; H01L
51/0072; H01L 51/0074; H01L 51/0078;
H01L 51/0086; H01L 51/0093; H01L
51/05; H01L 51/0504; H01L 51/0529;
H01L 51/0533; H01L 51/0562; H01L
51/0575; H01L 51/42; H01L 51/5206;
H01L 51/5262; H01L 51/5268; H01L
51/5284; G02B 26/005; G02B 21/0076;
G02B 26/004; G02B 3/14; G02B
21/0032; G02B 21/006; G02B 23/243;
G02B 23/2446; G02B 23/2469; G02B
23/26; G02B 6/06; G02B 26/0841; G02B
5/30; G02B 6/4214; G02B 1/002; G02B
1/14; G02B 2207/115; G02B 26/08;
G02B 5/3041; G02B 1/04; G02B 1/06;
G02B 1/115; G02B 1/18; G02B
2006/12104; G02B 26/023; G02B 26/101;
G02B 3/0012; G02B 3/0056; G02B 5/02;
G02B 5/201; G02B 5/3016; G02B
5/3033; G02B 5/3083; G02B 6/0051;
G02B 6/3518; G02B 6/3594; G02B
6/3652; G02B 6/3692; G02B 6/4226

See application file for complete search history.

(56) References Cited

U.S. PATENT DOCUMENTS

| | | | |
|---|---|---|---|
| 5,964,995 A | 10/1999 | Nikiforov et al. | |
| 6,352,758 B1 | 3/2002 | Huang et al. | |
| 6,565,727 B1 | 5/2003 | Shenderov | |
| 6,773,566 B2 | 8/2004 | Shenderov | |
| 6,911,132 B2 | 6/2005 | Pamula et al. | |
| 6,967,489 B2 | 11/2005 | Brooks et al. | |
| 6,977,033 B2 | 12/2005 | Becker et al. | |
| 7,052,244 B2 | 5/2006 | Fouillet et al. | |
| 7,053,009 B2 | 5/2006 | Conley, Jr. et al. | |
| 7,163,612 B2 | 1/2007 | Sterling et al. | |
| 7,215,306 B2 | 5/2007 | Lo | |
| 7,328,979 B2 | 2/2008 | Decre et al. | |
| 7,420,549 B2 | 9/2008 | Jacobson et al. | |
| 7,458,661 B2 | 12/2008 | Kim et al. | |
| 7,504,709 B2 | 3/2009 | Masuda et al. | |
| 7,531,072 B2 | 5/2009 | Roux et al. | |
| 7,547,380 B2 | 6/2009 | Velev | |
| 7,641,779 B2 | 1/2010 | Becker et al. | |
| 7,733,559 B2 | 6/2010 | Kawase et al. | |
| 7,767,069 B2 | 8/2010 | Lee et al. | |
| 7,902,680 B2 | 3/2011 | Tano et al. | |
| 7,976,795 B2 | 6/2011 | Zhou et al. | |
| 8,093,064 B2 | 1/2012 | Shah et al. | |
| 8,128,798 B2 | 3/2012 | Adachi et al. | |
| 8,159,644 B2 | 4/2012 | Takatori | |
| 8,173,000 B1 | 5/2012 | Hadwen et al. | |
| 8,187,864 B2 | 5/2012 | Wheeler et al. | |
| 8,319,759 B2 | 11/2012 | Jacobson et al. | |
| 8,349,276 B2 | 1/2013 | Pamula et al. | |
| 8,388,909 B2 | 3/2013 | Pollack et al. | |
| 8,409,417 B2 | 4/2013 | Wu | |
| 8,460,528 B2 | 6/2013 | Pollack et al. | |
| 8,514,479 B2 | 8/2013 | Bae et al. | |
| 8,525,966 B2 | 9/2013 | Takatori | |
| 8,529,743 B2 | 9/2013 | Kim et al. | |
| 8,547,111 B2 | 10/2013 | Hadwen et al. | |
| 8,587,513 B2 | 11/2013 | Ozawa | |
| 8,593,438 B2 | 11/2013 | Komatsu et al. | |
| 8,603,413 B2 | 12/2013 | Fouillet | |
| 8,653,832 B2 | 2/2014 | Hadwen et al. | |
| 8,764,958 B2 | 7/2014 | Wang | |
| 8,791,891 B2 | 7/2014 | Van Dijk et al. | |
| 8,810,882 B2 | 8/2014 | Heikenfeld et al. | |
| 8,815,070 B2 | 8/2014 | Wang et al. | |
| 8,834,695 B2 | 9/2014 | Wang et al. | |
| 8,858,772 B2 | 10/2014 | Crane et al. | |
| 8,926,811 B2 | 1/2015 | Wu | |
| 8,936,708 B2 | 1/2015 | Feiglin et al. | |
| 8,940,147 B1 | 1/2015 | Bartsch et al. | |
| 8,958,044 B2 | 2/2015 | Takatori | |
| 8,993,348 B2 | 3/2015 | Wheeler et al. | |
| 8,994,705 B2 | 3/2015 | Jacobson et al. | |
| 9,061,262 B2 | 6/2015 | Vann et al. | |
| 9,216,414 B2 | 12/2015 | Chu | |
| 9,266,076 B2 | 2/2016 | Kim et al. | |
| 9,458,489 B2 | 10/2016 | Lim et al. | |
| 9,458,543 B2 | 10/2016 | Hadwen | |
| 9,476,811 B2 | 10/2016 | Mudrik et al. | |
| 9,594,056 B2 | 3/2017 | Fobel et al. | |
| 9,610,582 B2 | 4/2017 | Kapur et al. | |
| 9,623,407 B2 | 4/2017 | Delamarche et al. | |
| 9,649,632 B2 | 5/2017 | Van Dam et al. | |
| 9,714,463 B2 | 7/2017 | White et al. | |
| 9,815,056 B2 | 11/2017 | Wu et al. | |
| 9,915,631 B2 | 3/2018 | Hoffmeyer et al. | |
| 9,983,169 B2 | 5/2018 | Bramanti | |
| 10,018,828 B2 | 7/2018 | Massard | |
| 10,486,156 B2 | 11/2019 | Campbell et al. | |
| 10,543,466 B2 | 1/2020 | Wu | |
| 10,646,454 B2 | 5/2020 | Liu et al. | |
| 10,695,737 B2 | 6/2020 | Lammertyn et al. | |
| 10,882,042 B2 | 1/2021 | French | |
| 2006/0039823 A1 | 2/2006 | Yamakawa et al. | |
| 2007/0023292 A1 | 2/2007 | Kim et al. | |
| 2008/0124252 A1 | 5/2008 | Marchand et al. | |
| 2008/0135411 A1 | 6/2008 | Whitehead et al. | |
| 2010/0032293 A1 | 2/2010 | Pollack et al. | |
| 2010/0225611 A1 | 9/2010 | Lee et al. | |
| 2011/0005931 A1* | 1/2011 | Zhe | B81C 99/002 204/600 |
| 2011/0220505 A1 | 9/2011 | Wang et al. | |
| 2011/0247934 A1 | 10/2011 | Wang et al. | |
| 2012/0273702 A1 | 11/2012 | Culbertson et al. | |
| 2013/0161193 A1 | 6/2013 | Jacobs et al. | |
| 2015/0377831 A1 | 12/2015 | Wheeler et al. | |
| 2016/0199832 A1 | 7/2016 | Jamshidi et al. | |
| 2016/0312165 A1 | 10/2016 | Lowe, Jr. et al. | |
| 2017/0315090 A1 | 11/2017 | Wheeler et al. | |
| 2018/0085756 A1* | 3/2018 | Kosaka | G01N 27/44786 |
| 2018/0311671 A1* | 11/2018 | Cook | B01L 3/502784 |
| 2019/0092623 A1* | 3/2019 | Ding | H01L 27/3227 |
| 2019/0210026 A1 | 7/2019 | Jebrail et al. | |
| 2020/0064705 A1 | 2/2020 | Kayal et al. | |
| 2020/0089035 A1 | 3/2020 | Tsai et al. | |
| 2020/0114135 A1 | 4/2020 | Paolini, Jr. et al. | |
| 2020/0347840 A1 | 11/2020 | Paolini, Jr. et al. | |
| 2020/0348576 A1 | 11/2020 | Visani et al. | |

FOREIGN PATENT DOCUMENTS

| | | |
|---|---|---|
| CN | 108452853 A | 8/2018 |
| JP | 2013076739 A | 4/2013 |

(56) References Cited

FOREIGN PATENT DOCUMENTS

| | | |
|---|---|---|
| TW | 200911375 A | 3/2009 |
| TW | 200916823 A | 4/2009 |
| TW | 201244824 A | 11/2012 |
| TW | 201632261 A | 9/2016 |
| WO | 2007120241 A2 | 10/2007 |
| WO | 2017075295 A1 | 5/2017 |

OTHER PUBLICATIONS https://en.wikipedia.org/wiki/Contact_angle, printed Dec. 16, 2020. 2020.

Choi, Kihwan et al., "Digital Microfluidics", Annu. Rev. Anal. Chem. 5:413-40 (2012). Apr. 9, 2012.

Qi, Lin et al., "Mechanical-activated digital microfluidics with gradient surface wettability", Lab Chip, vol. 19, pp. 223-232, (2019). Dec. 4, 2019.

Subramanian, R. Shankar et al., "Motion of a Drop on a Solid Surface Due to a Wettability Gradient", Langmuir, vol. 12, pp. 11844-11849, (2005). Nov. 4, 2005.

Yu, Xi et al., "Surface Gradient Material: From Superhydrophobicity to Superhydrophilicity", Langmuir, vol. 22, pp. 4483-4486, (2006). Apr. 7, 2006.

Ito, Yoshihiro et al., "The Movement of a Water Droplet on a Gradient Surface Prepared by Photodegradation", Langmuir, vol. 23, pp. 1845-1850, (2007). Dec. 22, 2006.

Nemani, Srinivasa Kartik et al., "Surface Modification of Polymers: Methods and Applications", Advanced Materials Interfaces, vol. 5, Issue 24, p. 1801247, Dec. 21, 2018. Dec. 21, 2018.

Abdelgawad, Mohamed et al., "The Digital Revolution: A New Paradigm for Microfluidics", Advanced Materials, vol. 21, pp. 920-925,(2009). Jan. 1, 2009.

Bhattacharjee, Biddut, "Study of Droplet Splitting in an Electrowetting Based Digital Microfluidic System", The University of British Columbia, Sep. 2012. Sep. 1, 2012.

Cho, Sung Kwon et al., "Creating, Transporting, Cutting, and Merging Liquid Droplets by Electrowetting-Based Actuation for Digital Microfluidic Circuits", Journal of Microelectromechanical Systems, vol. 12, No. 1, Feb. 2003. Feb. 1, 2003.

Nikapitiya, N. Y. Jagath B.et al., "Accurate, consistent, and fast droplet splitting and dispensing in electrowetting on dielectric digital microfluidics", Mirco and Nano Systems Letters, vol. 5, No. 24, Jun. 2017. Jun. 16, 2017.

Hadwen, B et al., "Programmable large area digital microfluidic array with integrated droplet sensing for bioassays", Lab on a Chip, Issue 18, (2012). May 22, 2012.

Cooney, Christopher G. et al., "Electrowetting droplet microfluidics on a single planar surface", Microfluisics and Nanofluidics, vol. 2, Issue 5, pp. 435-446 (Sep. 2006). Sep. 1, 2006.

Fouillet, Y. et al., "EWOD Digital Microfluidics for Lab on a Chip", International Conference on Nanochannels, Microchannels, and Minichannels, Paper No. ICNMM2006-96020, pp. 1255-1264, (Sep. 2008). Sep. 15, 2008.

Hlitzbleck, Martina et al., "Reagents in microfluidics: an 'in' and 'out' challenge", Chem. Soc. Rev., vol. 42, p. 8494, (2013). Mar. 27, 2013.

Walker, Shawn W. et al., "Modeling the Fluid Dynamics of Electro-Wetting On Dielectric (EWOD)", Journal of Microelectromechanical Systems, vol. 15, No. 4, pp. 986-1000, (Aug. 2006). Aug. 2006.

Li, Yiyan et al., "Improving the performance of electrowetting on dielectric microfluidics using piezoelectric top plate control", Sensors and Actuators B, vol. 229, pp. 63-74 (2016). 2016.

Barbulovic-Nad, Irena et al., "Digital microfluidics for cell-based assays", Lab Chip, vol. 8, pp. 519-526 (2008). Feb. 25, 2008.

Newman, Sharon et al., "High density DNA storage library via dehydration with digital microfluidic retrieval", Nature Communications, vol. 10, No. 1706 (2019). Apr. 12, 2019.

Dhindsa, Manjeet et al., "Virtual electrowetting channels: electronic liquid transport with continuous channel functionality", Lab on a Chip, Issue 7, pp. 832-836, (2010). Feb. 26, 2010.

International Preliminary Report on Patentability for Application No. PCT/US2020/061270, dated Jun. 2, 2022, 6 pages.

Korean Intellectual Property Office, PCT/US2020/061270, International Search Report and Written Opinion, dated Mar. 12, 2021.

Yong, K.W. et al., "Sliding behavior of droplet on a hydrophobic surface with hydrophilic cavities: A simulation study", Phys. Fluids 30, 122006 (2018).

Wu, Huaping et al., "Smart design of wettability-patterned gradients on substrate-independent coated surfaces to control unidirectional spreading of droplets", Soft Matter, vol. 13, p. 2995 (2017).

European Office Action for Application No. 20890019.1, dated Nov. 24, 2023, 7 pages.

\* cited by examiner

Increasing Contact Angle

SPATIALLY VARIABLE HYDROPHOBIC LAYERS FOR DIGITAL MICROFLUIDICS

RELATED APPLICATIONS

This application claims priority to U.S. Provisional Application No. 62/937,897, filed Nov. 20, 2019. All references, patents, and patent applications disclosed herein are incorporated by reference in their entireties.

BACKGROUND

Figure 1:
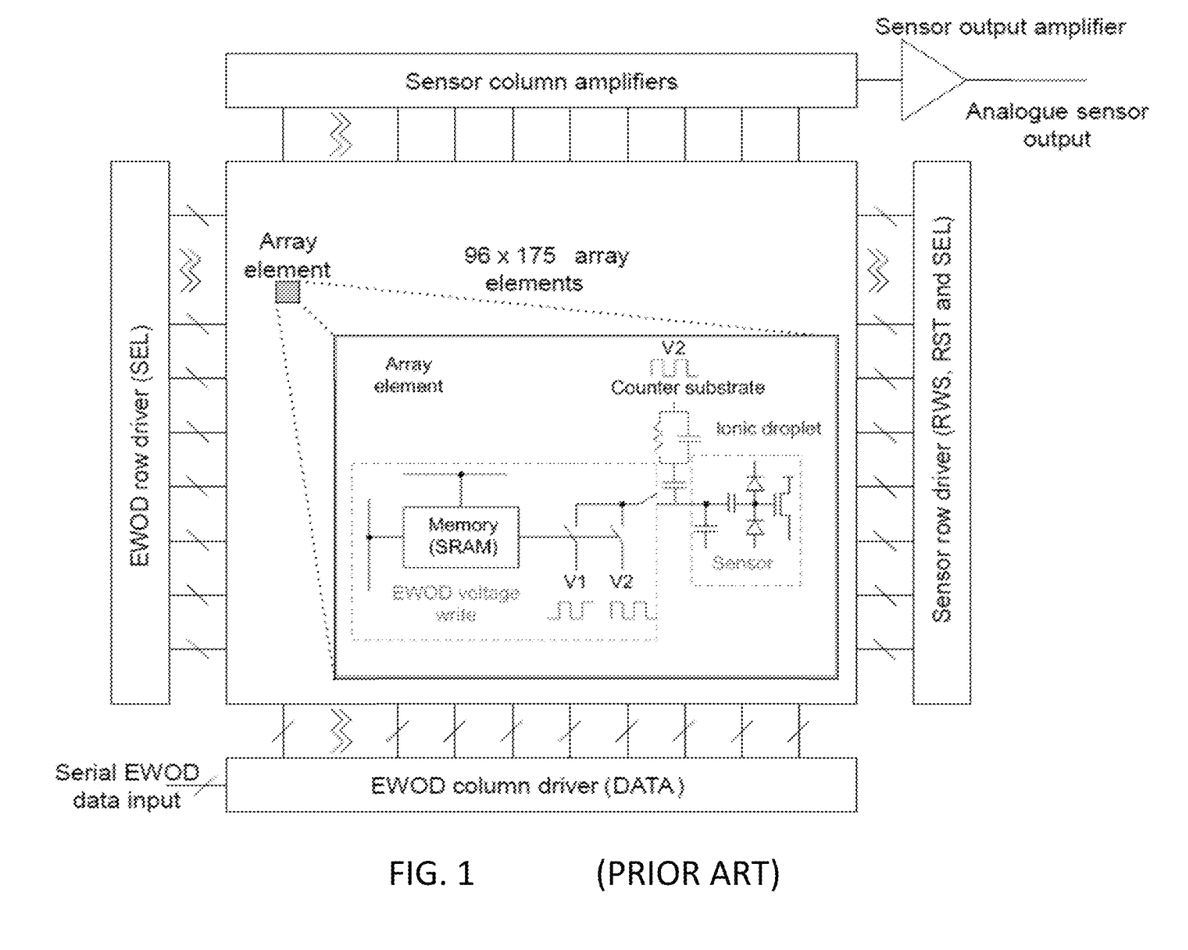
FIG. 1 shows a prior art EWoD device including both propulsion and sensing on the same active matrix.

Digital microfluidic (DMF) devices use independent electrodes to propel, split, and join droplets in a confined environment, thereby providing a "lab-on-a-chip." Digital microfluidic devices are alternatively referred to as electrowetting on dielectric, or "EWoD," to further differentiate the method from competing microfluidic systems that rely on electrophoretic flow and/or micropumps. FIG. 1 illustrates a typical EWoD device including both propulsion and sensing on the same active matrix. A 2012 review of the electrowetting technology was provided by Wheeler in "Digital Microfluidics," *Annu. Rev. Anal. Chem.* 2012, 5:413-40. The technique allows sample preparation, assays, and synthetic chemistry to be performed with tiny quantities of both samples and reagents. In recent years, controlled droplet manipulation in microfluidic cells using electrowetting has become commercially viable, and there are now products available from large life science companies, such as Oxford Nanopore.

Typically, EWoD devices include a stack of a conductor, an insulator dielectric layer, and a hydrophobic layer. A droplet is placed on the hydrophobic layer, and the stack, once actuated, can cause the droplet to deform and wet or de-wet from the surface depending on the applied voltage. Most of the literature reports on EWoD involve so-called "passive matrix" devices (a.k.a. "segmented" devices), whereby ten to twenty electrodes are directly driven with a controller. While segmented devices are easy to fabricate, the number of electrodes is limited by space and driving constraints. Accordingly, it is not possible to perform massive parallel assays, reactions, etc. in passive matrix devices. In comparison, "active matrix" devices (a.k.a. active matrix EWoD, a.k.a. AM-EWoD) devices can have many thousands, hundreds of thousands or even millions of addressable electrodes. The electrodes are typically switched by thin-film transistors (TFTs) and droplet motion is programmable so that AM-EWoD arrays can be used as general purpose devices that allow great freedom for controlling multiple droplets and executing simultaneous analytical processes.

In biological and chemical applications, the content of the water droplet (e.g., proteins, DNA) can have a major impact on its wetting properties on the hydrophobic layer, specifically related to the resting contact angle of the particular droplet formulation. Thus, it is often required to electrically actuate droplets differently depending on what their contents are. Given that in certain applications it is possible to generate a wide range of droplet formulations that can span several tens of degrees of contact angle for various concentrations/constituents, it would be desirable to provide conditions to accommodate this variability. While the changes in contact angle can partially be done with the addition of surfactant, but is not feasible in many cases to add substantial quantities of surfactant to a reaction liquid with biological molecules because the surfactant may cause damage to the biological molecules.

SUMMARY OF INVENTION

In a first aspect, there is provided a digital microfluidic device, comprising: a substrate comprising a plurality of driving electrodes coupled to a set of thin-film-transistors, and including a dielectric layer covering both the plurality of driving electrodes and the set of thin-film-transistors; a controller operatively coupled to the set of thin-film-transistors and configured to provide a driving voltage to at least a portion of the plurality of driving electrodes, and a spatially variable wettability layer covering the dielectric layer. In one embodiment, the spatially variable wettability layer comprises a first portion having a first contact angle, and a second portion having a second contact angle. A difference between the first contact angle and the second contact angle may be in the range from least 20° to at most 160°. Alternatively, a difference between the first contact angle and the second contact angle may be in the range of at least 50° to at most 140°. In another, non-exclusive embodiment, the spatially variable wettability layer comprises at least a portion having a contact angle gradient. A difference in contact angle between a first end of the gradient and a second end of the gradient may be in the range from at least 20° to at most 160°. Alternatively, a difference in contact angle between a first end of the gradient and a second end of the gradient may be from at least 50° to at most 140°. The contact angle gradient may be located at an inlet or reservoir entry point for introducing liquids from an external source into the digital microfluidic device. In one embodiment, the device further includes a singular top electrode, a top hydrophobic layer covering the singular top electrode and a spacer separating the variable wettability layer and top hydrophobic layer and creating a microfluidic region between the variable wettability and top hydrophobic layers. In one embodiment, the top hydrophobic layer covering the singular top electrode is a spatially variable wettability layer. The spatially variable wettability layer covering the singular top electrode may include a first portion having a first contact angle, and a second portion having a second contact angle. The spatially variable hydrophobic layer covering the singular top electrode may include at least a portion having a contact angle gradient. In a further, non-exclusive embodiment, the singular top electrode includes at least one light-transmissive region. The light-transmissive region may be at least 10 mm² in area. In an additional embodiment, the electrodes of the device are arranged in an array.

In another aspect, there is provided a method of manufacturing a microfluidic device, the method including: coupling a substrate comprising a plurality of driving electrodes to a set of thin-film-transistors; forming a dielectric layer covering the plurality of driving electrodes and the set of thin-film-transistors; operatively coupling a controller to the set of thin-film-transistors, wherein the controller is configured to provide a driving voltage to at least a portion of the plurality of driving electrodes, and forming a spatially variable wettability layer covering the dielectric layer. In one embodiment, the forming a spatially variable wettability layer includes: depositing a first material having a first contact angle to form a first zone of the spatially variable wettability layer, and depositing a second material having a second contact angle to form a second zone of the spatially variable wettability layer. A difference between the first contact angle and the second contact angle may be in the range from at least 20° to at most 160°. Alternatively, a difference between the first contact angle and the second contact angle may be in the range from at least 50° to at most 140°. In one embodiment, the forming a spatially variable wettability layer includes: depositing a mixture comprising a hydrophilic material and a hydrophobic material, to form a layer precursor covering the dielectric layer; placing a mask over the surface of the layer precursor, to protect a selected region of the surface, and exposing the surface to a treatment that removes a portion of the hydrophobic material to expose a portion of the hydrophilic material in the unprotected region. The treatment that removes a portion of the hydrophobic material may include exposing the unprotected region to electromagnetic radiation inducing photodegradation of the hydrophobic material. In a number of embodiments, the forming a spatially variable wettability layer includes forming a contact angle surface gradient. In one embodiment, the forming the contact angle surface gradient includes: forming a precursor surface covering the dielectric layer, and covalently binding a hydrophobic molecule to the dielectric layer, to form a density gradient along the precursor surface. In another embodiment, the forming the contact angle surface gradient includes: forming a hydrophobic precursor layer covering the dielectric layer, and irradiating the hydrophobic precursor layer with a spatially variable laser dose. In a further embodiment, the forming the contact angle surface gradient includes: forming a hydrophobic precursor layer covering the dielectric layer, and irradiating the hydrophobic precursor layer with vacuum ultraviolet light, through a filter or photomask, to induce patterned photodegradation. A difference in contact angle between a first end of the gradient and a second end of the gradient may be in the range from at least 20° to at most 160°. Alternatively, a difference in contact angle between a first end of the gradient and a second end of the gradient may be in the range from at least 50° to at most 140°.

DETAILED DESCRIPTION

In a first aspect, the present invention provides an active matrix electrowetting on dielectric (AM-EWoD) device including a substrate, a dielectric layer, and a variable wettability layer covering the dielectric layer. As depicted herein, the substrate includes a plurality of electrodes actuated by thin-film transistors (TFT) to propel various droplets through a microfluidic region. Though wettability gradients and spatial variation in hydrophobic layers have been investigated in the prior art, these concepts have not made their way to digital microfluidics systems relying on electrode actuation, nor have the specific utilities for such spatial variation been specifically developed to address challenges in DMF systems.

In some instances, surfactants are used to tune the contact angle; however, there are other instances where the presence of a surfactant is incompatible with the chemistry of the application at hand. In such situations, variations in wettability on the coating surface may enable different aqueous formulations to have similar contact angles, thus allowing for the same electrical driving scheme across the entire surface of an array and for simpler, more reliable and straightforward electrical actuation.

Additionally, an aqueous droplet will tend to preferentially migrate toward an area of lower contact angle if exposed to a hydrophobic gradient. This tendency can be useful for preferentially causing droplets to migrate in a chosen direction in a digital microfluidics device, for example to ensure proper droplet migration from reservoir and inlet entry points where liquids are introduced from an external source.

Figure 2:
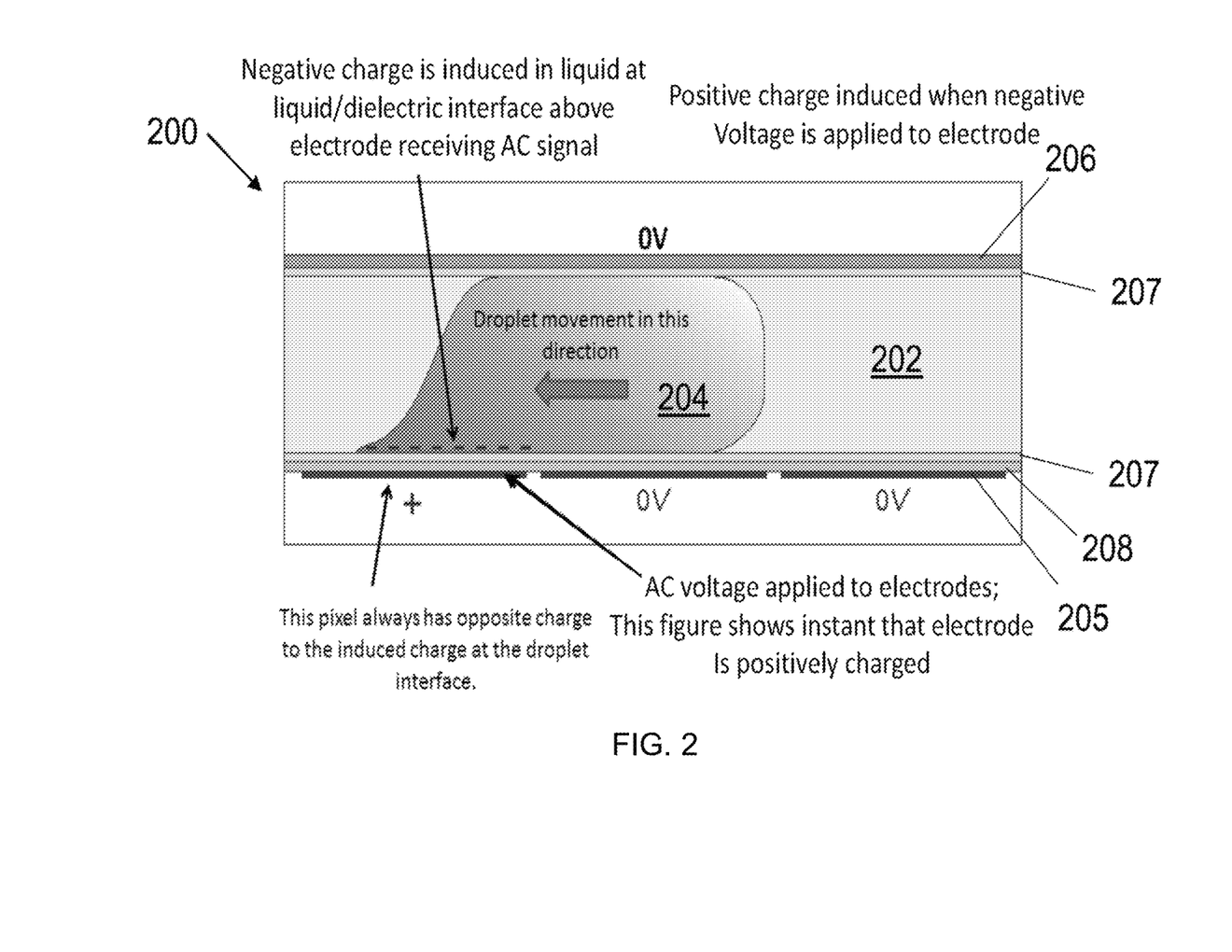
FIG. 2 depicts the movement of an aqueous-phase droplet between adjacent electrodes by providing differing charge states on adjacent electrodes.

The fundamental operation of an exemplary EWoD device is illustrated in the sectional image of FIG. 2. The EWoD 200 includes a cell filled with an oil 202 and at least one aqueous droplet 204. The cell spacer is typically in the range 50 to 200 µm, but the spacer can be larger. In a basic configuration, as shown in FIG. 2, a plurality of driving electrodes 205 are disposed on the substrate and a singular top electrode 206 is disposed on the opposing surface. The cell additionally includes hydrophobic layers 207 on the surfaces contacting the oil layer, as well as a dielectric layer 208 between the driving electrodes 205 and the hydrophobic coating 207. (The upper substrate may also include a dielectric layer, but it is not shown in FIG. 2). Each hydrophobic layer is typically 20 to 60 nm thick and prevents the droplet from wetting its respective surface. When no voltage differential is applied between adjacent electrodes, the droplet will maintain a spheroidal shape to minimize contact with the hydrophobic surfaces (oil and hydrophobic layer).

While it is possible to have a single layer for both the dielectric and hydrophobic functions, such layers typically require thick inorganic layers (to prevent pinholes) with resulting low dielectric constants, thereby requiring more than 100V for droplet movement. To achieve low voltage actuation, it is usually better to have a thin inorganic layer for high capacitance and to be pinhole free, topped by a thin organic hydrophobic layer. With this combination it is possible to have electrowetting operation with voltages in the range +/−10 to +/−50V, which is in the range that can be supplied by conventional TFT arrays.

When a voltage differential is applied between adjacent electrodes, the voltage on one electrode attracts opposite charges in the droplet at the dielectric-to-droplet interface, and the droplet moves toward this electrode, as illustrated in FIG. 2. The voltages needed for acceptable droplet propulsion depend on the properties of the dielectric and hydrophobic layers. AC driving is used to reduce degradation of the droplets, dielectrics, and electrodes by various electrochemistries. Operational frequencies for EWoD can be in the range 100 Hz to 1 MHz, but lower frequencies of 1 kHz or lower are preferred for use with TFTs that have limited speed of operation.

Figure 3:
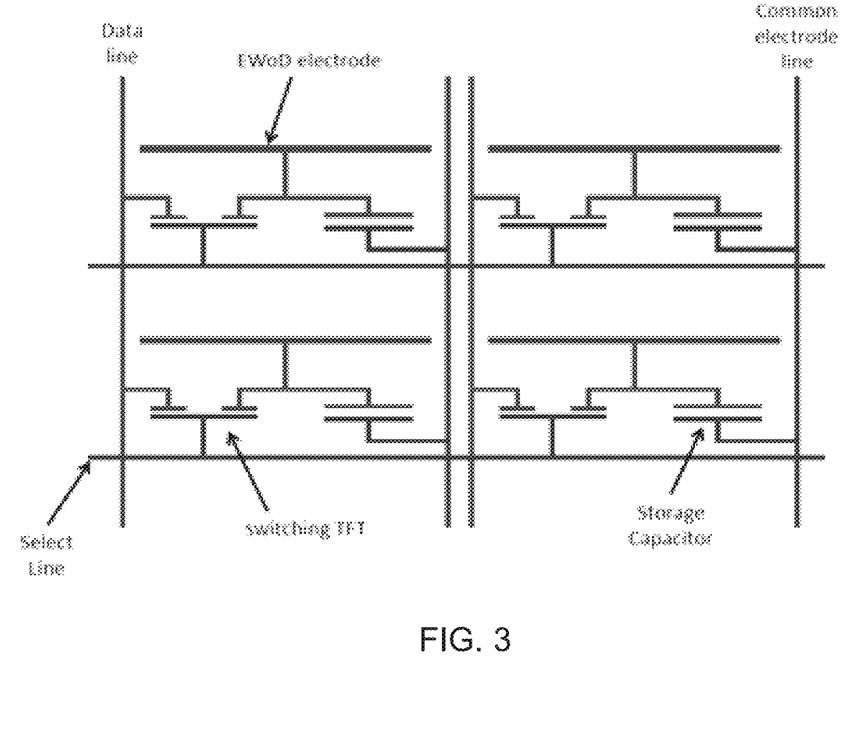
FIG. 3 shows a TFT architecture for a plurality of driving electrodes of an EWoD device of the invention.

As shown in FIG. 2, the top electrode 206 is a single conducting layer normally set to zero volts or a common voltage value (VCOM) to take into account offset voltages on the driving electrodes 205 due to capacitive kickback from the TFTs that are used to switch the voltage on the electrodes (see FIG. 3). The top electrode can also have a square wave applied to increase the voltage across the liquid. Such an arrangement allows for lower driving voltages to be used for the TFT connected driving electrodes 205 because total field experienced by a droplet is the sum of the top plate voltage 206 is additional to the voltage supplied by the TFT.

As shown in FIG. 3, an active matrix of driving electrodes can be arranged to be driven with data and gate (select) lines much like an active matrix in a liquid crystal display. The gate (select) lines are scanned for line-at-a time addressing, while the data lines carry the voltage to be transferred to driving electrodes for electrowetting operation. If no movement is needed, or if a droplet is meant to move away from a driving electrode, then 0V will be applied to that (non-target) driving electrode. If a droplet is meant to move toward a driving electrode, an AC voltage will be applied to that (target) driving electrode.

The TFT may be constructed by creating alternating layers of differently-doped Si structures along with various electrode lines, with methods know to those of skill in the art. The dielectric should be thin enough and have a dielectric constant compatible with low voltage AC driving, such as available from conventional image controllers for LCD displays. For example, the dielectric layer may comprise a layer of approximately 20-40 nm $SiO_2$ topped over-coated with 200-400 nm plasma-deposited silicon nitride. Alternatively, the dielectric may comprise atomic-layer-deposited $Al_2O_3$ between 2 and 100 nm thick, preferably between 20 and 60 nm thick.

Hydrophobic materials may be formed into coatings by deposition onto the surface of the dielectric via suitable techniques, to form hydrophobic layers. Depending on the hydrophobic material to be applied, example deposition techniques include spin coating, molecular vapor deposition, and chemical vapor deposition. Hydrophobic layers may be more or less wettable as usually defined by their respective contact angles. Unless otherwise specified, the term "contact angle" is understood to refer to the contact angle of a surface in relation to a droplet of deionized (DI) water. If water has a contact angle between $0<\theta<90°$, then the surface is classed as hydrophilic, whereas a surface producing a contact angle between $90°<\theta<180°$ is considered hydrophobic. Usually, moderate contact angles are considered to fall in the range from about 90° to about 120°, while high contact angles are typically considered to fall in the range from about 120° to about 160°. In instances where the contact angle is $160°<\theta$, then the surface is commonly known as superhydrophobic or ultrahydrophobic. Surface wettabilities may be measured by analytical methods well known in the art, for instance by dispensing a droplet on the surface and performing contact angle measurements using a contact angle goniometer. Anisotropic hydrophobicity may be examined by tilting substrates with gradient surface wettability along the transverse axis of the pattern and examining the minimal tilting angle that can move a droplet. A greater discussion of contact angle can be found at http://en.wikipedia.org/wiki/Contact_angle (last accessed Nov. 17, 2020), which is incorporated by reference.

Hydrophobic layers of moderate contact angle typically include one or a blend of fluoropolymers, such as PTFE (polytetrafluoroethylene), FEP (fluorinated ethylene propylene), PVF (polyvinylfluoride), PVDF (polyvinylidene fluoride), PCTFE (polychlorotrifluoroethylene), PFA (perfluoroalkoxy polymer), FEP (fluorinated ethylene-propylene), ETFE (polyethylenetetrafluoroethylene), and ECTFE (polyethylenechlorotrifluoroethylene). Commercially available fluoropolymers include Cytop® (AGC Chemicals, Exton, PA) and Teflon® AF (Chemours, Wilmington, DE). An advantage of fluoropolymer films is that they can be highly inert and can remain hydrophobic even after exposure to oxidizing treatments such as corona treatment and plasma oxidation.

Coatings having higher contact angles may be fabricated one or more superhydrophobic materials. As anticipated above, contact angles on superhydrophobic materials typically exceed 160°, meaning that only a small percentage of a droplet base is in contact with the surface. This imparts an almost spherical shape to the water droplet. Certain fluorinated silanes, perfluoroalkyls, perfluoropolyethers and RF plasma-formed superhydrophobic materials have found use as coating layers in electrowetting applications and render it relatively easier to slide along the surface. Some types of composite materials are characterized by chemically heterogeneous surfaces where one component provides roughness and the other provides low surface energy so as to produce a coating with superhydrophobic characteristics. Biomimetic superhydrophobic coatings rely on a delicate micro or nano structure for their repellence, but care should be taken as such structures are apt to be easily damaged by abrasion or cleaning.

Figure 5:
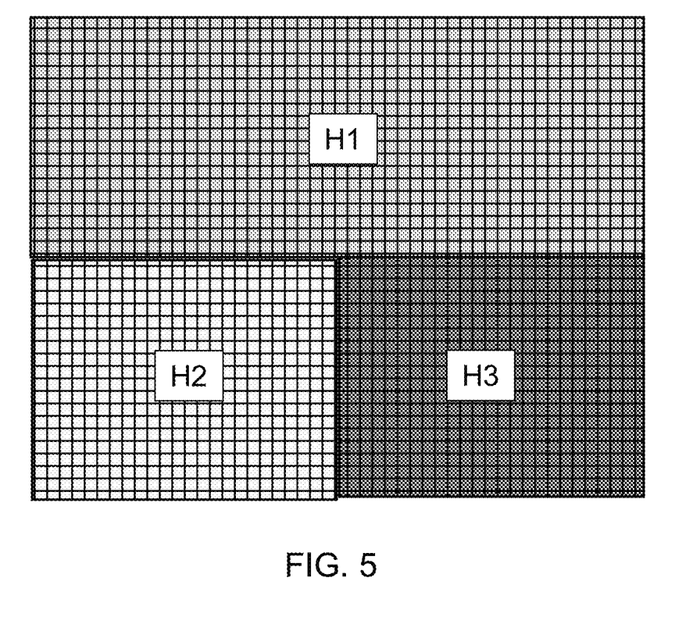
FIG. 5 is a schematic top view of a digital microfluidics array where the hydrophobic coating layer includes region H1 having contact angle $\theta_{c1}$, region H2 with contact angle $\theta_{c2}$, and region H3 characterized by contact angle $\theta_{c3}$.

In a representative embodiment, a given layer may be partitioned in two or more portions characterized by differing contact angles. Each portion is broad enough such that a droplet deposited on the portion may come to rest onto an area isotropic in wettability. FIG. 5 illustrates an example digital microfluidic array where the hydrophobic coating layer includes region H1 having contact angle $\theta_{c1}$, region H2 with contact angle $\theta_{c2}$, and region H3 characterized by contact angle $\theta_{c3}$. Variations in hydrophobicity between two portions may be measured in terms of contact angle differences. As such, the surface wettability change experienced by a drop migrating from H2 to H1 may be expressed as $\Delta_{c1c2}=\theta_{c1}-\theta_{c2}$, while that between H3 and H2 may be $\Delta\theta_{c1c2}=\theta_{c3}-\theta_{c2}$, and so forth. Each of $\theta_{c1}$, $\theta_{c2}$, and $\theta_{c3}$, and the respective $\Delta\theta$'s may be chosen to provide wettability profiles best suited to droplets of different fluids. In a representative embodiment, the $\Delta\theta$ between any two regions of a hydrophobic layer is independently chosen from within the range $20°\leq\Delta\theta\leq160°$. In another embodiment, the range is $20°\leq\Delta\theta\leq135°$. In further embodiments, the range may be $20°\leq\Delta\theta\leq120°$, $20°\leq\Delta\theta\leq90°$, or $20°\leq\Delta\theta\leq60°$, respectively. Other configurations where the range may be $160°\leq\Delta\theta\leq180°$, $120°\leq\Delta\theta\leq180°$, $90°\leq\Delta\theta\leq180°$, or $50°\leq\Delta\theta\leq180°$ are also contemplated.

Figure 4:
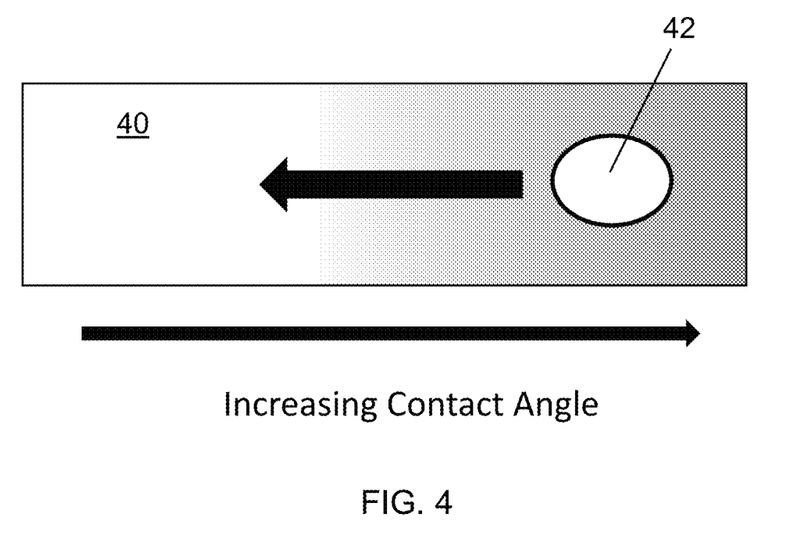
FIG. 4 is a schematic top view of a hydrophobic gradient that reflects an increasing water contact angle from left to right.

Alternatively, at least a portion of a layer may exhibit a gradual rather than step-wise variation in wettability in the form of a hydrophobic gradient whereby the contact angle with water increases or decreases along a given direction. In a gradient, areas having a given contact angle may be sufficiently narrow such that a droplet deposited on a more hydrophobic area will tend to migrate towards a less hydrophobic area, as illustrated in *Langmuir* 2005, 21, 11844-11849. FIG. 4 illustrates a hydrophobic layer 40 characterized by a hydrophobic gradient that results in an increasing water contact angle from left to right. As anticipated above, an aqueous droplet 42 will tend to preferentially migrate to an area of lower contact angle if deposited on a surface having a hydrophobic gradient. Hence, the surface may be patterned with one or more gradients individually tailored to specific droplet types or classes.

When establishing the parameters of a gradient, one needs to bear in mind that to move the droplet along desired directions, the surface wettability should be within an appropriate range. If the surface is too hydrophilic, the droplet may stick on the substrate. If the surface is too hydrophobic, the droplet may move out of the pattern. In a representative embodiment, the overall $\Delta\theta$ in contact angle between two ends of a gradient is chosen from within the range $20°\leq\Delta\theta\leq160°$. In another embodiment, the range is $20°\leq\Delta\theta\leq135°$. In further embodiments, the range may be $20°\leq\Delta\theta\leq120°$, $20°\leq\Delta\theta\leq90°$, or $20°\leq\Delta\theta\leq60°$, respectively. Other gradients where the range may be $160°\leq\Delta\theta\leq180°$, $120°\leq\Delta\theta\leq180°$, $90°\leq\Delta\theta\leq180°$, or $50°\leq\Delta\theta\leq140°$ are also contemplated.

Also, the droplet may move from the more hydrophobic to the more hydrophilic area of a surface with a velocity that depends at least in part on the steepness of the gradient. The steeper the gradient, the faster a droplet may be expected to move, and the quasi-steady speed of the drop in a wettability gradient can be predicted, as illustrated in *Langmuir* 2005, 21, 11844-11849.

Figure 6:
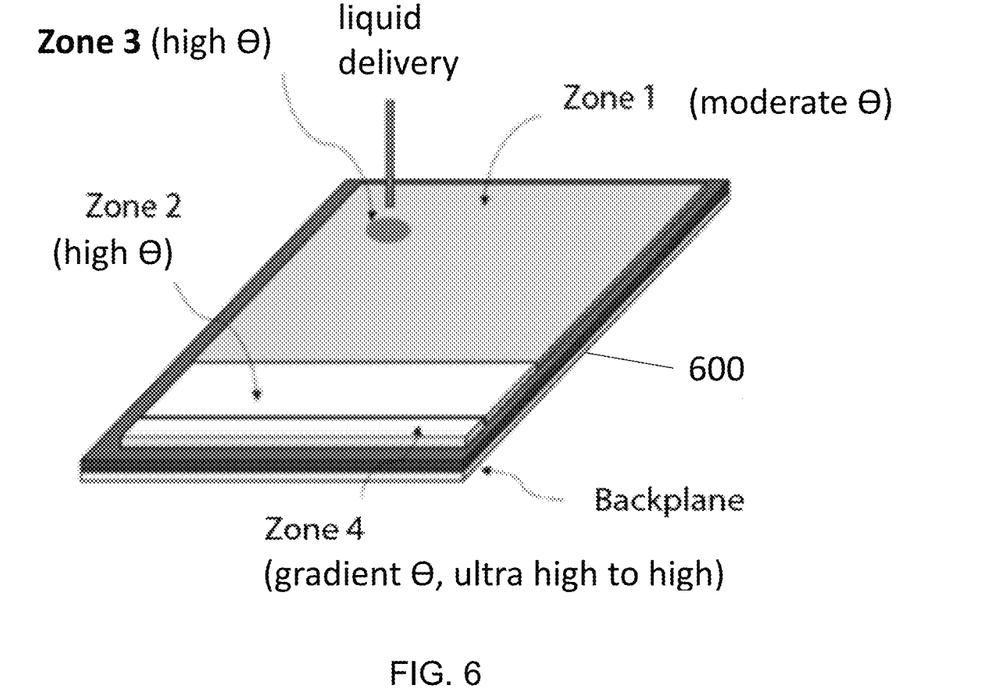
FIG. 6 is a top perspective view of an example device having an array of electrodes covered by the hydrophobic layer zones as shown.

FIG. 6 illustrates an example device, for example a TFT or a segmented digital microfluidics device, having an array of electrodes covered by the hydrophobic layer zones as shown. The device also includes a top substrate (see FIG. 7) which may also be coated with similar combinations of hydrophobic layer zones. The use of "top" and "bottom" is merely a convention as the locations of the two substrates can be switched, and the device can be oriented in a variety of ways, for example, the top and bottom substrates can be roughly parallel while the overall device is oriented so that the substrates are normal to a work surface. In one embodiment, the top substrate includes a light-transmissive region, for example 10 mm$^2$ in area, to enable visual or spectrophotometric monitoring of the droplets inside the device (not shown). A liquid inlet may be introduced as a tube or perforation through the top substrate. Four distinct functional zones are of note in FIG. 6: Zone 1 having a moderate contact angle that is suited for most operations; Zone 2 having a higher contact angle than Zone 1; Zone 3, where the inlet is placed, is characterized by a contact angle such that an introduced liquid tends to move away from the inlet to settle in a zone having a lower contact angle, such as Zone 2. In the gradient Zone 4 of FIG. 6, the hydrophobicity of the surface gradually declines from superhydrophobic to highly hydrophobic values, such that side-loaded droplets migrate inwards towards Zone 2. Alternatively, a gradient can be used to facilitate removal of droplets from the microfluidic device, for example to recover a sample, or to extract a synthesized product.

A layer partitioned in two or more portions characterized by different contact angles may be accomplished by covering each portion with a specific coating composition having the contact angle intended for such portion, resulting in a hydrophobic layer partitioned with a variable wettability as desired. In another method, the entirety of the layer is covered with the same coating, for example a hydrophobic polymer, then one or more portions of the surface undergo a treatment that removes portions of the polymer, thus forming a patterned surface where the untreated portions have preserved the highest degree of hydrophobicity while the treated portions are more hydrophilic. Unless otherwise specified, the term "covering" in relation to a layer covering a given item is not to be interpreted as necessarily implying that the layer and item are in physical contact; rather, and depending on the requirements of the application at hand, one or more additional, intermediate layers may be interposed between the covering layer and the item. In addition, the covering layer is not required to cover the absolute entirety of the item; rather, there may be gaps or uncovered sections to suit the requirements of the application at hand.

In another embodiment, and as exemplified in U.S. Pat. No. 6,352,758, a hydrophilic material, for instance inorganic oxide particles such as colloidal silica, is dispersed in a polymer matrix that is formed into a layer precursor covering the dielectric layer. A mask such as a screen is then placed over the surface of the layer precursor such that the mask protects selected regions of the surface while unprotected regions of the surface are exposed to further treatment steps. The surface is then exposed to a treatment that selectively removes a portion of the polymer matrix to expose an intended amount of the hydrophilic material in the unprotected region. The region that is protected by the screen maintains its original hydrophobicity. Thus, this method produces a patterned surface matching the pattern of the screen.

Several methods for preparing gradient surfaces, including thermal, vapor-phase diffusion, electrochemical, photolithographic, gradual immersion, photoinitiator-mediated photopolymerization, corona treatment, contact printing, microfluidic device, and microstructured approaches have been devised, and these techniques are usually based on a generation process, as illustrated in *Langmuir* 2007, 23, 1845-1850.

In one example generation process reported in *Langmuir* 2006, 22, 4483-4486, a relatively dilute first solution of a hydrophobic thiol molecule, for example $HS(CH_2)_{11}CH_3$ 0.05 mmol/L, was found to bind to a gold substrate at a density that can be controlled by varying the immersion time. Slowly adding the dilute solution to the container holding the rough gold substrate will lead to a density gradient along the surface. After the complementary adsorption of $HS(CH_2)_{10}CH_2OH$, where the —OH moiety imparts a hydrophilic character to its point of attachment, the surface exhibits a gradient from superhydrophobicity to superhydrophilicity. The slope of the gradient can be conveniently tuned by varying the speed of addition.

Conversely, gradients may also be formed by treating one or more zones of a layer following deposition of a hydrophobic or superhydrophobic material, as seen in *Adv. Mater. Interfaces* 2018, 1801247. In some techniques, the layer may be treated with an injection of energy inducing change in surface topography, surface chemistry, or both, for example by degradation induced by heat, electromagnetic radiation, electron beam, plasma, and the like. In one embodiment, the electromagnetic radiation source is a laser and irradiation with spatially varied laser dose may be accomplished by changing operating parameters of the laser source, such as gray scale (GS), raster intensity (RI), number of engraving cycles (n), laser spot size, lateral traveling speed, laser repetition rate, and laser spatial resolution. In one configuration disclosed in *Lab Chip*, 2019, 19, 223, GS and RI allow independent control of the laser power in temporal and spatial domains, n determines the total laser dose, and the other operating parameters are kept constant, although other configurations may be chosen depending on the application at hand. In another embodiment, and as seen in *Langmuir* 2007, 23, 1845-1850 and U.S. Pat. No. 7,902, 680 the gradient surface may be prepared by patterned photodegradation obtained with vacuum ultraviolet light (VUV) or other frequencies suited to the application at hand through a filter or photomask, to create a smooth or coarse gradient as needed.

In one exemplary application, the surface pattern features linear cascades of rectangular areas, the gradient being along either the long or short edge of the rectangles. By increasing the dose of photodegradation-inducing light in a gradual fashion, for example during laser or VUV etching, two or more increasingly hydrophilic areas can be formed. As such, a pattern may be formed with a first area at the more hydrophobic edge within the pattern, a more hydrophilic edge at the opposite side of the pattern, and a pattern center characterized by intermediate wettability.

It will be apparent to those skilled in the art that numerous changes and modifications can be made in the specific embodiments of the invention described above without departing from the scope of the invention. Accordingly, the whole of the foregoing description is to be interpreted in an illustrative and not in a limitative sense.

Example 1

An EWoD may be manufactured by coupling a substrate 600 including driving electrodes to a set of thin-film-transistors. A controller for providing a driving voltage to the driving electrodes may be operatively coupled to the thin-film-transistors, and driving electrodes and thin-film-transistors can be covered with a dielectric layer. The dielectric layer may be coated with a spatially variable wettability layer. The spatially variable wettability layer may partitioned on the backplane 600 as illustrated in the diagram of FIG. 6.

Each material may be deposited on its respective zone while the other zones are masked off, thereby generating differences in relative hydrophobicity along the surface. Specifically, Zone 3 of the liquid inlet may coated with a superhydrophobic nanoparticle/polymer blend having a contact angle $150°<\theta_1<180°$. Zone 1 may be instead coated with a moderately hydrophobic material characterized by a contact angle $90°<\theta_2<120°$, for example one or more fluoropolymers such as those commercially available as Teflon® and Cytop®. The wettability differential between the two zones would lead aqueous droplets placed on the surface of the inlet to migrate away from Zone 3. Each material may be deposited on its respective zone while the other areas are masked off, thereby generating differences in relative hydrophobicity along the surface.

Figure 7:
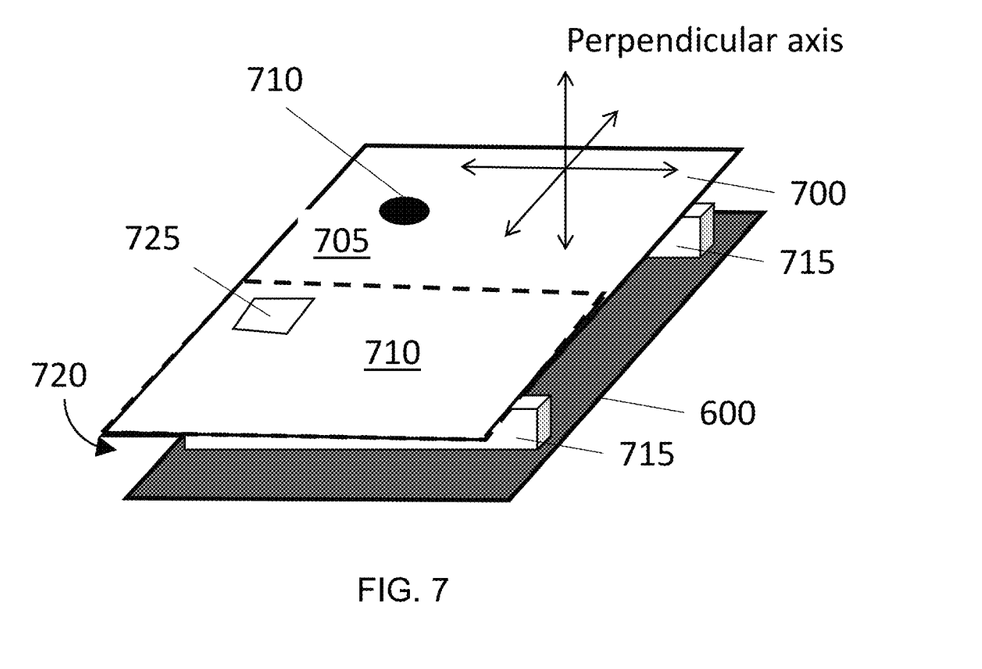
FIG. 7 shows a digital microfluidic device including a backplane including an array of electrodes covered by the hydrophobic layer zone and a top plate including variable zones of hydrophobicity.

A singular top electrode 700 covered by one or more top hydrophobic layers (705, 710) may also be added to the assembly, with spacers 715, thereby creating a microfluidic workspace 720 as exemplified in the schematic diagram of FIG. 7. The top hydrophobic layers 705, 710 may have differing hydrophobicities to facilitate movement of droplets according to a particular workflow. The top hydrophobic layers 705, 710 may mirror the Zones described above with respect to the hydrophobic regions of the backplane, that is the contact angles of the first and second variable wettability layers (bottom and top, according to FIG. 7) are the same along an axis perpendicular to the plane of the substrate comprising a plurality of driving electrodes. However, in other embodiments, the contact angles of the first and second variable wettability layers are different along an axis perpendicular to the plane of the substrate comprising a plurality of driving electrodes. The singular top electrode 700 may include one or more openings 710 to allow introduction of liquids, reagents, etc., or removal of liquids, products, etc.

The singular top electrode 700 may also include a light-transmissive region 725, as shown in FIG. 7. Such a light-transmissive region will allow observation of the progress of one or more droplet processes, (e.g., with a microscope) or detection of the presence of a marker, such as a fluorescent tag. In some embodiments, the light-transmissive region 725 is at least 10 mm$^2$ in area, however, the area can be made larger or smaller, as needed.

Alternatively, or in addition to partitioning the variable wettability layer into discrete patches, a wettability gradient may be established where the contact angle is at a maximum $\theta_1$ at the inlet and gradually declines until the moderate contact angle $\theta_2$ of Zone 1 is reached. As such, each inlet may be fitted with a gradient characterized by an overall drop in wettability $\Delta\theta=\theta_1-\theta_2$ that is specifically suited to the types of fluid to be introduced through the inlet. For example, the $\Delta\theta=\theta_1-\theta_2$ value may be in the range from about 20° to 90° depending on the characteristics such as the ionic strength, pH, and concentration of the fluid introduced via the inlet. The gradient may also be steeper or milder depending on the speed that is to be imparted to fluid droplets traveling along the gradient.

The invention claimed is:

1. An active matrix electrowetting on dielectric (AM-EWoD) device, comprising:
    a substrate comprising a plurality of driving electrodes coupled to a set of thin-film-transistors, and including a dielectric layer covering both the plurality of driving electrodes and the set of thin-film-transistors;
    a controller operatively coupled to the set of thin-film-transistors and configured to provide a driving voltage to at least a portion of the plurality of driving electrodes, and
    a spatially variable wettability layer covering the dielectric layer, wherein the spatially variable wettability layer has portions which are hydrophobic, and portions which are superhydrophobic, and
    a top hydrophobic layer covering a singular top electrode, wherein the top hydrophobic layer includes a second spatially variable wettability layer.

2. The active matrix electrowetting on dielectric (AM-EWoD) device of claim 1, wherein the spatially variable wettability layer comprises a first portion having a first contact angle between 90° and 160°, and a second portion having a second contact angle which is greater than 160°.

3. The active matrix electrowetting on dielectric (AM-EWoD) device of claim 2, wherein a difference between the first contact angle and the second contact angle is at least 20°.

4. The active matrix electrowetting on dielectric (AM-EWoD) device of claim 2, wherein a difference between the first contact angle and the second contact angle is at least 50°.

5. The active matrix electrowetting on dielectric (AM-EWoD) device of claim 1, wherein the spatially variable wettability layer comprises at least a portion having a contact angle gradient.

6. The active matrix electrowetting on dielectric (AM-EWoD) device of claim 5, wherein a difference in contact angle between a first end of the gradient and a second end of the gradient is at least 20°.

7. The active matrix electrowetting on dielectric (AM-EWoD) device of claim 5, wherein a difference in contact angle between a first end of the gradient and a second end of the gradient is at least 50°.

8. The active matrix electrowetting on dielectric (AM-EWoD) device of claim 5, wherein the contact angle gradient is located at an inlet or reservoir entry point for introducing liquids from an external source into the digital microfluidic device.

9. The active matrix electrowetting on dielectric (AM-EWoD) device of claim 1, further comprising a spacer separating the spatially variable wettability layer and the top hydrophobic layer and creating a microfluidic region between the spatially variable wettability layer and top hydrophobic layers.

10. The active matrix electrowetting on dielectric (AM-EWoD) device of claim 1, wherein the second spatially variable wettability layer covering the singular top electrode comprises a first portion having a first contact angle, and a second portion having a second contact angle.

11. The active matrix electrowetting on dielectric (AM-EWoD) device of claim 10, wherein the contact angles of the spatially variable wettability layer and the second spatially variable wettability layers are the same along an axis perpendicular to the plane of the substrate comprising a plurality of driving electrodes.

12. The active matrix electrowetting on dielectric (AM-EWoD) device of claim 10, wherein the contact angles of the spatially variable wettability layer and the second spatially variable wettability layers are not the same along an axis perpendicular to the plane of the substrate comprising a plurality of driving electrodes.

13. The active matrix electrowetting on dielectric (AM-EWoD) device of claim 12, wherein a difference between the contact angles of the first and second variable wettability layers along an axis perpendicular to the plane of the substrate comprising a plurality of driving electrodes is at least 20° 1.

14. The active matrix electrowetting on dielectric (AM-EWoD) device of claim 1, wherein the second spatially variable wettability layer covering the singular top electrode comprises at least a portion having a contact angle gradient.

15. The active matrix electrowetting on dielectric (AM-EWoD) device of claim 9, wherein the singular top electrode includes at least one light-transmissive region.

16. The active matrix electrowetting on dielectric (AM-EWoD) device of claim 15, wherein the light-transmissive region is at least 10 mm$^2$ in area.

17. A method of manufacturing an active matrix electrowetting on dielectric (AM-EWoD) device, the method comprising:
coupling a substrate comprising a plurality of driving electrodes to a set of thin-film-transistors;
operatively coupling a controller to the set of thin-film-transistors, wherein the controller is configured to provide a driving voltage to at least a portion of the plurality of driving electrodes;
forming a dielectric layer covering the plurality of driving electrodes and the set of thin-film-transistors;
forming a spatially variable wettability layer covering the dielectric layer, wherein the spatially variable wettability layer has a hydrophobic region and a superhydrophobic region, and
a top hydrophobic layer covering a singular top electrode, wherein the top hydrophobic layer includes a second spatially variable wettability layer.

18. The method of manufacturing the active matrix electrowetting on dielectric (AM-EWoD) device of claim 17, wherein forming the spatially variable wettability layer comprises:
depositing a first material having a first contact angle to form a first zone of the spatially variable wettability layer, and
depositing a second material having a second contact angle to form a second zone of the spatially variable wettability layer.

19. The method of manufacturing the active matrix electrowetting on dielectric (AM-EWoD) device of claim 18, wherein forming the spatially variable wettability layer comprises depositing each material on its respective zone while the other zones are masked off, thereby generating one or more differences in relative hydrophobicity along the surface.

* * * * *